(12) United States Patent
Hwang et al.

(10) Patent No.: US 8,422,275 B2
(45) Date of Patent: Apr. 16, 2013

(54) MAGNETIC MEMORY DEVICE AND METHOD

(75) Inventors: In-jun Hwang, Yongin-si (KR); Tae-wan Kim, Yongin-si (KR); Won-cheol Jeong, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 870 days.

(21) Appl. No.: 12/372,492

(22) Filed: Feb. 17, 2009

(65) Prior Publication Data

US 2009/0197350 A1 Aug. 6, 2009

Related U.S. Application Data

(62) Division of application No. 11/164,579, filed on Nov. 29, 2005, now Pat. No. 7,508,699.

(30) Foreign Application Priority Data

Dec. 3, 2004 (KR) .................. 10-2004-0101119

(51) Int. Cl.
*G11C 11/00* (2006.01)

(52) U.S. Cl. ........ 365/158; 365/148; 365/171; 257/295; 977/935

(58) Field of Classification Search .................. 257/421, 257/422, 427, E21.665, E27.006, 295, 158; 365/158, 48, 55, 62, 66, 74, 78, 80–93, 100, 365/130, 131, 148, 171–173, 209, 213, 225.5, 365/230.07, 232, 243.5; 438/3; 977/933–935
See application file for complete search history.

(56) References Cited

U.S. PATENT DOCUMENTS

| | | | |
|---|---|---|---|
| 5,640,343 A | 6/1997 | Gallagher et al. | |
| 6,081,445 A | 6/2000 | Shi et al. | |
| 6,385,083 B1 | 5/2002 | Sharma et al. | |
| 6,430,084 B1 | 8/2002 | Rizzo et al. | |
| 6,483,734 B1 | 11/2002 | Sharma et al. | |
| 6,667,899 B1 | 12/2003 | Subramanian et al. | |
| 6,703,654 B1 | 3/2004 | Horng et al. | |
| 6,724,653 B1 | 4/2004 | Iwata et al. | |
| 6,778,428 B2 | 8/2004 | Joo | |
| 6,781,871 B2 | 8/2004 | Park et al. | |

(Continued)

FOREIGN PATENT DOCUMENTS

| | | |
|---|---|---|
| CN | 1400607 A | 3/2003 |
| CN | 1402254 A | 3/2003 |

(Continued)

*Primary Examiner* — Harry W Byrne

(74) *Attorney, Agent, or Firm* — Buchanan Ingersoll & Rooney PC

(57) ABSTRACT

An exemplary embodiment of a magnetic random access memory (MRAM) device includes a magnetic tunnel junction having a free layer, a first electrode (first magnetic field generating means) having a first portion that covers a surface of the free layer, and an electric power source connected to the first electrode via a connection that covers less than half of the first portion of the first electrode. Another exemplary embodiment of an MRAM device includes a magnetic tunnel junction, first and second electrodes (first and second magnetic field generating means) directly connected to the magnetic tunnel junction on opposite sides of the magnetic tunnel junction, and an electric power source having one pole connected to the first electrode via a first connection and having a second pole connected to the second electrode via a second connection, wherein the first and second connections are laterally offset from the connections between the first and second electrodes and the magnetic tunnel junction. Methods of operating and manufacturing these magnetic random access memories are also disclosed.

16 Claims, 16 Drawing Sheets

U.S. PATENT DOCUMENTS

| | | |
|---|---|---|
| 6,815,783 B2 | 11/2004 | Kim et al. |
| 6,853,599 B2 | 2/2005 | Oh et al. |
| 2002/0006058 A1* | 1/2002 | Nakajima et al. ............ 365/171 |
| 2003/0026125 A1 | 2/2003 | Hidaka |
| 2003/0198080 A1* | 10/2003 | Iwata ............................ 365/158 |
| 2004/0125647 A1* | 7/2004 | Tsuchida et al. ............. 365/158 |
| 2004/0174740 A1 | 9/2004 | Lee et al. |

FOREIGN PATENT DOCUMENTS

| | | |
|---|---|---|
| JP | 2003-060173 A | 2/2003 |
| JP | 2003-133530 A | 9/2003 |
| JP | 2004-103212 A | 2/2004 |
| JP | 2004-179183 A | 6/2004 |
| KR | 1020020076460 A | 10/2002 |
| WO | 2004/100169 A2 | 11/2004 |

* cited by examiner

MAGNETIC MEMORY DEVICE AND METHOD

Priority is claimed under 35 U.S.C. 119 to Korean Patent Application No. 10-2004-0090495, which was filed on Dec. 3, 2004 in the Korean Intellectual Property Office, the disclosure of which is incorporated herein in its entirety by reference.

BACKGROUND INFORMATION

Various aspects of Magnetic Random Access Memory (MRAM) devices are described for example in U.S. Pat. Nos. 5,640,343, 6,081,445, 6,667,899, 6,430,084, 6,853,599, 6,815,783, 6,781,871, and 6,778,428, each herein incorporated by reference.

An exemplary known MRAM device includes a magnetic tunnel junction (MTJ) having two layers of magnetic material that sandwich a non-magnetic layer. A first one of the magnetic layers, which can be referred to at the "pinned" layer, has a fixed magnetic orientation, and the other magnetic layer, which can be referred to as the "free" layer, has a changeable magnetic orientation. An electrical resistance across the layers of the MTJ varies depending on the magnetic orientation of the free layer with respect to the pinned layer. When the magnetic orientations are parallel (geometrically parallel and pointing in the same direction), the resistance is lower than when the magnetic orientations are anti-parallel (geometrically parallel and pointing in opposite directions). Subjecting the free layer to a magnetic field above a strength threshold can cause the magnetic orientation of the free layer to change, and remain changed after the magnetic field is removed until another magnetic field is applied to change the magnetic orientation of the free layer back to what it was.

U.S. Pat. No. 5,640,343 describes, for example, an arrangement where an array of MTJs is placed between electrically conductive lines so that each line on a first side of the array passes over a column of MTJs, and each line on the second, opposite side of the array passes over a row of the MTJs. Thus the array is sandwiched between sets of parallel conductive lines where the lines on one side of the sandwich are perpendicular to the lines on the other side of the sandwich. When a current is passed through one of the lines, it produces a magnetic field that influences each of the MTJs underneath it. The array is configured so that the magnetic field from only one line is not sufficient to change the magnetic orientation of MTJs underneath it, but the combined magnetic field experienced by an MTJ when the lines on both sides of it are activated is sufficient to change the magnetic orientation of that MTJ's free layer (when the fields are opposite to an initial magnetic orientation of the free layer). Thus passing a current through one of the column lines and one of the row lines switches only one MTJ, the MTJ sandwiched between both the column line and the row line at the intersection or crossover region of the column line and the row line. The state of the MTJ (e.g. high or low resistance) can be discerned or read, for example, by applying either a voltage or a current across the MTJ and monitoring the corresponding current or voltage.

Lines to provide magnetic fields to switch one or more MTJs can be bulky and magnetic fields applied to switch an MTJ can adversely affect neighboring MTJs, particularly as size of MTJs and/or MRAM devices containing MTJs is reduced.

SUMMARY

An exemplary magnetic random access memory device includes a magnetic tunnel junction including a free layer, a first magnetic field generating component having a first portion that covers a surface of the free layer, and an electric power source connected to the first magnetic field generating component via a connection that covers less than half of the first portion of the first magnetic field generating means.

Another exemplary magnetic random access memory device includes a magnetic tunnel junction, first and second magnetic field generating component directly connected to the magnetic tunnel junction on opposite sides of the magnetic tunnel junction, and an electric power source having one pole connected to the first magnetic field generating component via a first connection and having a second pole connected to the second electrode via a second connection, wherein the first and second connections are laterally offset from the connections between the first and second magnetic field generating component and the magnetic tunnel junction.

An exemplary method for controlling a magnetic random access memory device, including a magnetic tunnel junction and first and second magnetic field generating component directly connected to the magnetic tunnel junction on opposite sides of the magnetic tunnel junction, includes switching the device via a first electric current traversing the first and second magnetic field generating component in directions substantially parallel to direct connections between the first and second magnetic field generating component and the magnetic tunnel junction.

In yet another exemplary embodiment, a method of manufacturing a magnetic memory device is disclosed. The method includes forming a transistor in a substrate; forming on the substrate a first interlayer insulating layer covering the transistor; forming in the first interlayer insulating layer a via hole exposing a source of the transistor; filling the via hole with a conductive plug; forming on the first interlayer insulating layer a first magnetic field generating component contacting the conductive plug; and forming an MTJ (magnetic tunnel junction) on a predetermined region of the first magnetic field generating component separated from the conductive plug.

In a further exemplary embodiment, another method of manufacturing a magnetic memory device is disclosed. The method includes forming a transistor in a substrate; forming on the substrate a first interlayer insulating layer covering the transistor; forming in the first interlayer insulating layer a via hole exposing a source of the transistor; filling the via hole with a conductive plug; forming on the first interlayer insulating layer an MTJ (magnetic tunnel junction) cell covering a top surface of the conductive plug; forming on the first interlayer insulating layer a second interlayer insulating layer surrounding sides of the MTJ; and forming on the second interlayer insulating layer a first magnetic field generating component having a first end portion contacting a top surface of the MTJ and a second end portion contacting the bit line.

BRIEF DESCRIPTION OF THE DRAWINGS

The accompanying drawings provide visual representations which will be used to more fully describe the representative embodiments disclosed herein and can be used by those skilled in the art to better understand them and their inherent advantages. In these drawings, like reference numerals identify corresponding elements.

DETAILED DESCRIPTION

Figure 1:
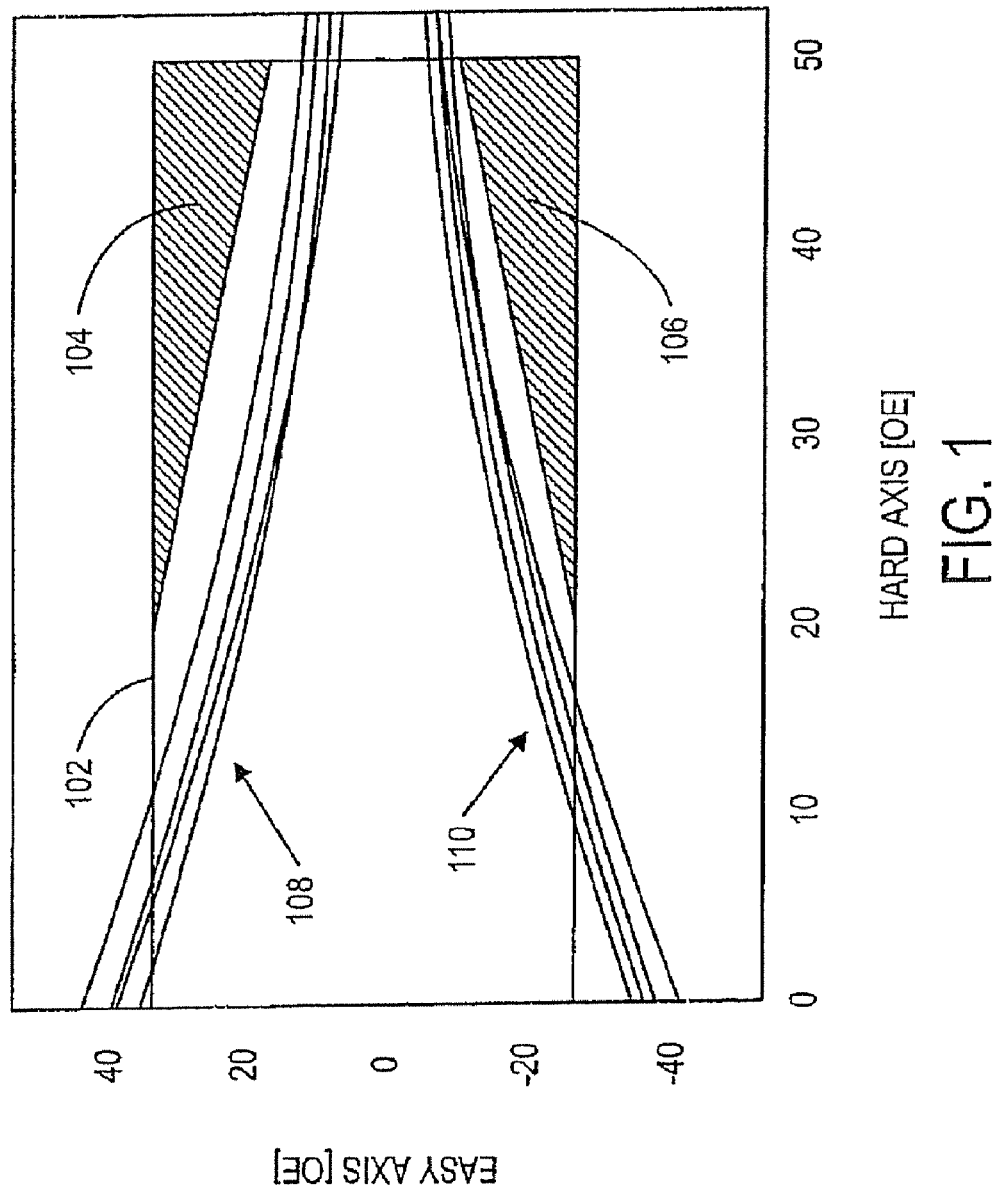
FIG. 1 illustrates exemplary switching behavior of magnetic tunnel junctions in a magnetic random access memory device.

The curves 108, 110 shown in FIG. 1 represent exemplary switching behavior of hypothetical MTJs. In particular, each curve represents a set of minimum value combinations of magnetic field strength along the hard and easy axes of an MTJ or MTJ free layer, at which the MTJ will switch. Thus, switching will occur in regions above the curves 108, and below the curves 110. In practice, available magnetic field strength values can be limited, for example to those within the region circumscribed by the box 102. The regions 104 and 106 are within the box 102 but represent sub-regions where the currents and consequent magnetic fields applied to switch an MTJ, also disturb or adversely affect neighboring MTJs. The regions within the box 102 that lie between the sub-regions 104 and the curves 108, and the regions within the box 102 between the curves 110 and the sub-region 106, are the available write windows. As MRAM density is increased, these windows can diminish and become too small to reliably or practically operate the MRAM.

Exemplary embodiments described herein provide methods and configurations that require less switching current, and/or allow higher MRAM densities without adverse switching effects on neighboring MTJ cells.

Figure 2:
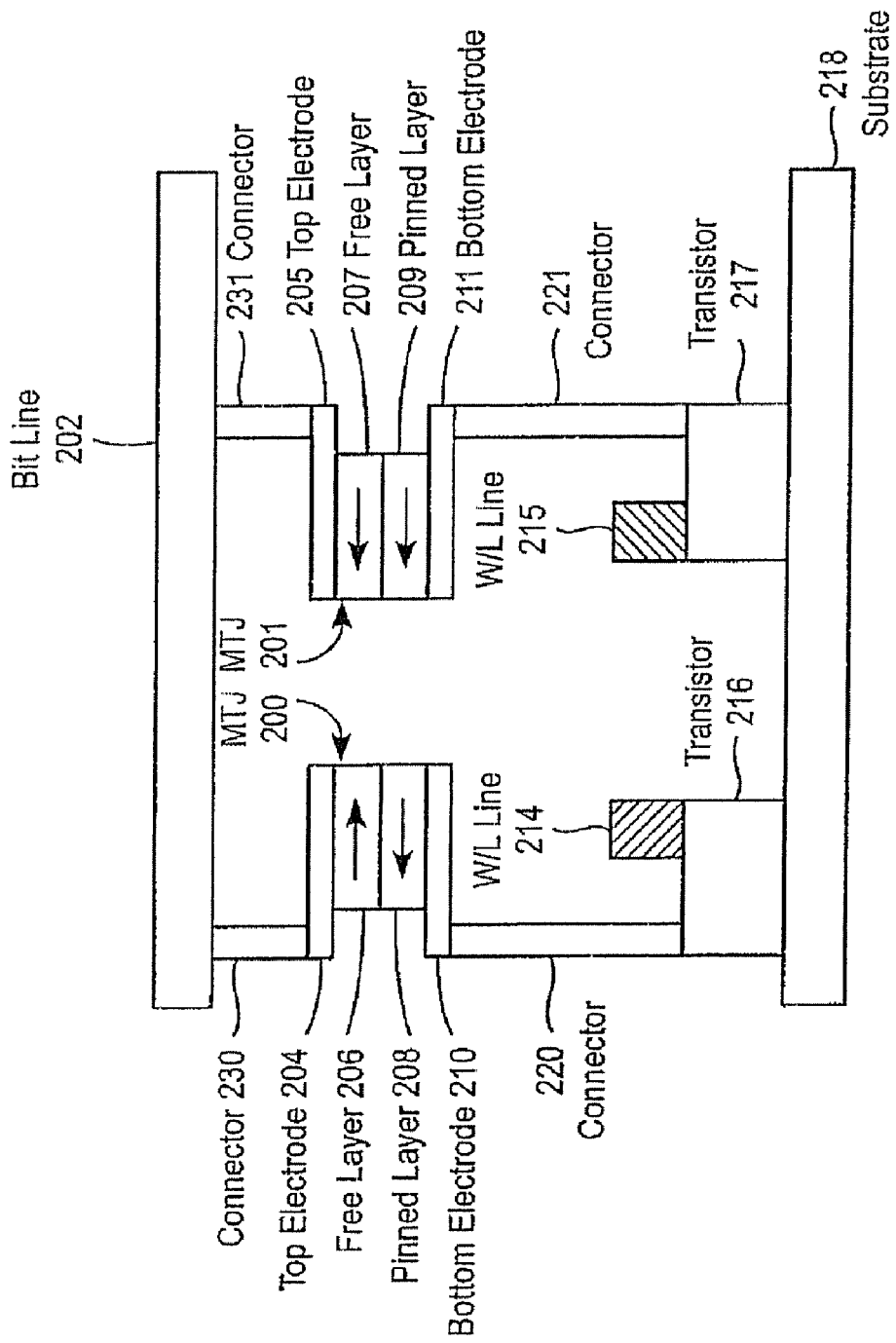
FIG. 2 illustrates an exemplary embodiment of a magnetic random access memory device.

FIG. 2 illustrates an exemplary embodiment of a magnetic random access memory device wherein a first magnetic field generating means, e.g. a top electrode 204, has a first portion that covers a surface of a free layer 206 of an MTJ 200. An electric power source including for example the bit line 202 connects to the electrode 204 via a connection (e.g. the connector 203) that covers less than half of the first portion of the top electrode 204, and which can (as shown in FIG. 2) cover only a second portion of the electrode 204 wherein the second portion is next to, but does not cover or lie over, the free layer 206. Thus, as shown for example in FIG. 2, in an exemplary embodiment a connection of a power source such as the bit line 202 to the top electrode 204 is laterally offset from an electrical connection between the top electrode 204 and the MTJ 200. Thus, current flowing between the connectors 220, 230 will also traverse the top electrode 204 in a direction substantially parallel to a direct connection between the top electrode 204 and the free layer 206 of the MTJ 200, for example in a direction parallel to a plane of the free layer surface covered by the top electrode 204. The combined effect of magnetic fields resulting from electric current flow through the bit line 202 and electric current traversing the top electrode 204 can be sufficient to switch the MTJ 200, and reverse a magnetization direction of the free layer 206. The second magnetic field generating component (e.g., the bottom electrode) 210 can be offset as shown, so return current flowing through the bottom electrode 210 will flow in a direction parallel to the contact surface of the MTJ 200. The electromagnetic field generated by this current flow through the bottom electrode 210 in a direction parallel to the contact surface of the MTJ can affect switching of the MTJ because the magnetic field is generated by the bottom electrode 210 and the top electrode 202 are in the same direction at the MTJ.

In an embodiment, the bottom electrode 210 can have zero offset or zero lateral displacement on the pinned-layer side of the MTJ while the top electrode 204 has an offset. Likewise, the top electrode 204 might not be offset, while the bottom electrode 210 is offset.

The electric current required to switch the MTJ 200 via magnetic fields generated by the bit line 204 and the top electrode 204 is less than that required for switching the MTJs in prior art configurations that do not have this offset. In addition, the digit lines shown in FIG. 1 are omitted from the embodiment of FIG. 2, which also allows the configuration shown in FIG. 2 to be simpler and more compact.

As shown in FIG. 2, the MTJ 200 includes both a free layer 206 and a pinned layer 208 which are shown having anti-parallel magnetization directions (i.e., magnetization directions that are geometrically parallel but opposite, resulting in a state of high(er) resistance). Also shown is a bottom electrode 210 that together with a connector 220 connects the pinned layer 208 of the MTJ 200 to a transistor 216 on a substrate 418. As will be apparent from FIG. 5, the transistors 216 can be controlled by applying an appropriate voltage or current to a gate of the transistor 216 via the W/L line 214.

FIG. 2 also shows another MTJ 201, connected via a top electrode 205 and a connector 231 to the bit line 202, and connected via a bottom electrode 211 and a connector 221 to a transistor 217 on a substrate 218. The transistor 217 is controlled via a W/L line 215 connected to a gate of the transistor 217, for example in the fashion illustrated in FIG. 3. As with the top electrode 204, the top electrode 205 has a connection to the bit line 202 via the connector 231 that is offset from a connection between the top electrode 205 and the MTJ 201. As with the top electrode 204 and the MTJ 200, this offset allows current to traverse the top electrode 205 over the MTJ 201 in a direction parallel to a connection between the top electrode 205 and the MTJ 201, thereby augmenting a magnetic field induced by the bit line 202 in such a way as to switch the MTJ 201 when the current through the bit line 202 and the current traversing the top electrode 205 are sufficient.

Figure 3:
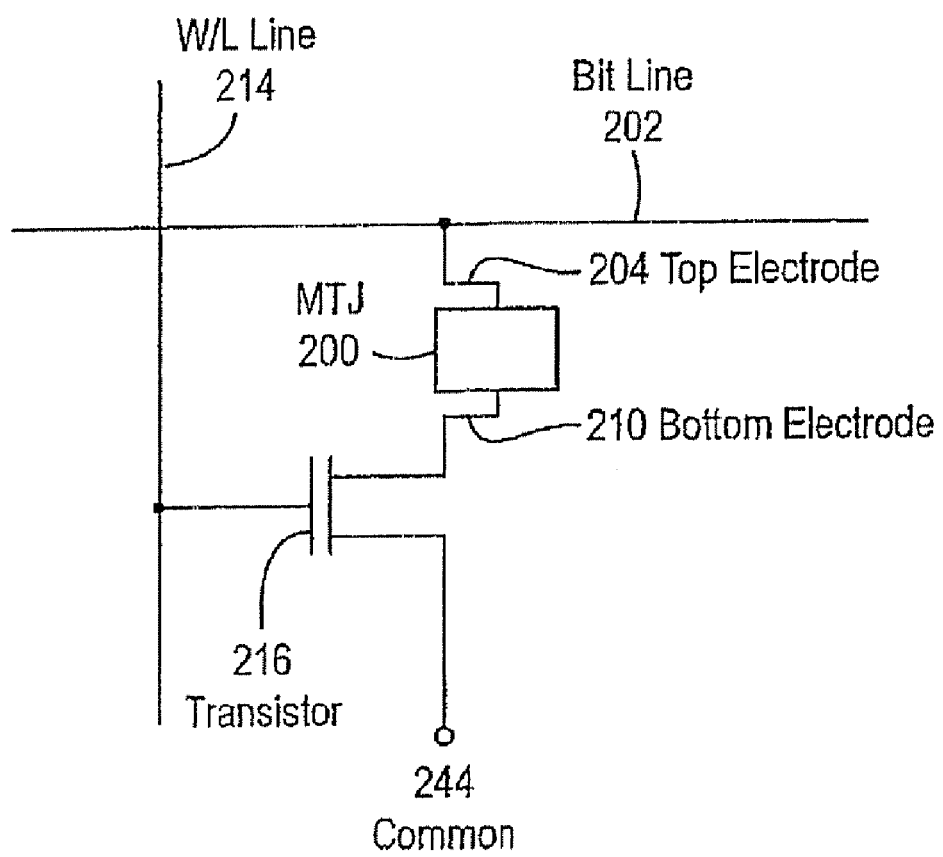
FIG. 3 illustrates an electronic circuit diagram of the device shown in FIG. 2.

As shown in FIG. 3, the transistor 216 is controlled via the W/L line 214 connected to its gate, and the source and drain of the transistor 216 are connected to a common connection (e.g., a ground connection) 244 and the bottom electrode 210. In an exemplary embodiment, the transistors 216, 217 are field effect transistors (FETs), in particular, field effect transistors that are partially turned on when a zero voltage is applied to a gate of the transistor, and are fully turned on when a positive voltage is applied to the gate of the transistor. Also note that a circuit diagram representation of the MTJ 201, the transistor 217 and associated components can also correspond to the circuit diagram shown in FIG. 3.

As can be seen from FIG. 3, the transistor 216 can be used to control (e.g., allow, regulate or prevent) electric current flow between the bit line 202 and the common connection 244 through the MTJ 200. In particular, the transistor 216 can be used to both write a desired state into the MTJ 200, as well as read a present state of the MTJ 200. For example, a first current flowing through the bit line 202 over the MTJ 200 and a second current flowing through the MTJ 200 and traversing the top electrode 204 can together provide a magnetic field sufficient to switch a magnetization direction of the free layer 206 of the MTJ 200. A lesser current through the MTJ 200, and/or a lesser voltage across the MTJ 200 that results in a lesser current so that the MTJ 200 will not be switched, can be applied between the bit line 202 and the common 244 connected to a drain of the transistor 216 to read the state of the MTJ 200 (e.g., to discern whether the MTJ 200 is in a high or low resistance state). In essence, the bit line 202 functions as one pole of an electric power source, and the common 244 shown in FIG. 3 functions as another pole of the electric power source.

Figure 4A:
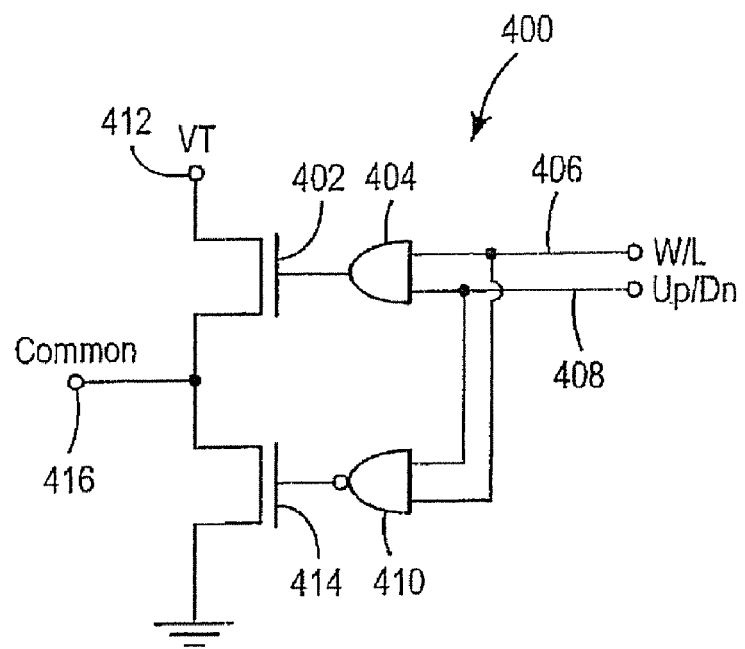
FIG. 4A illustrates a first exemplary circuit diagram.
Figure 4B:
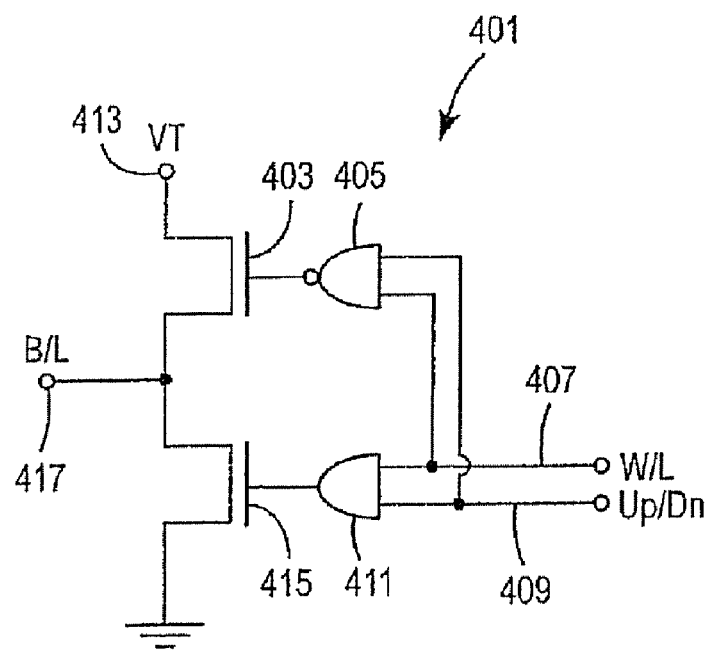
FIG. 4B illustrates a second exemplary circuit diagram.
Figure 6:
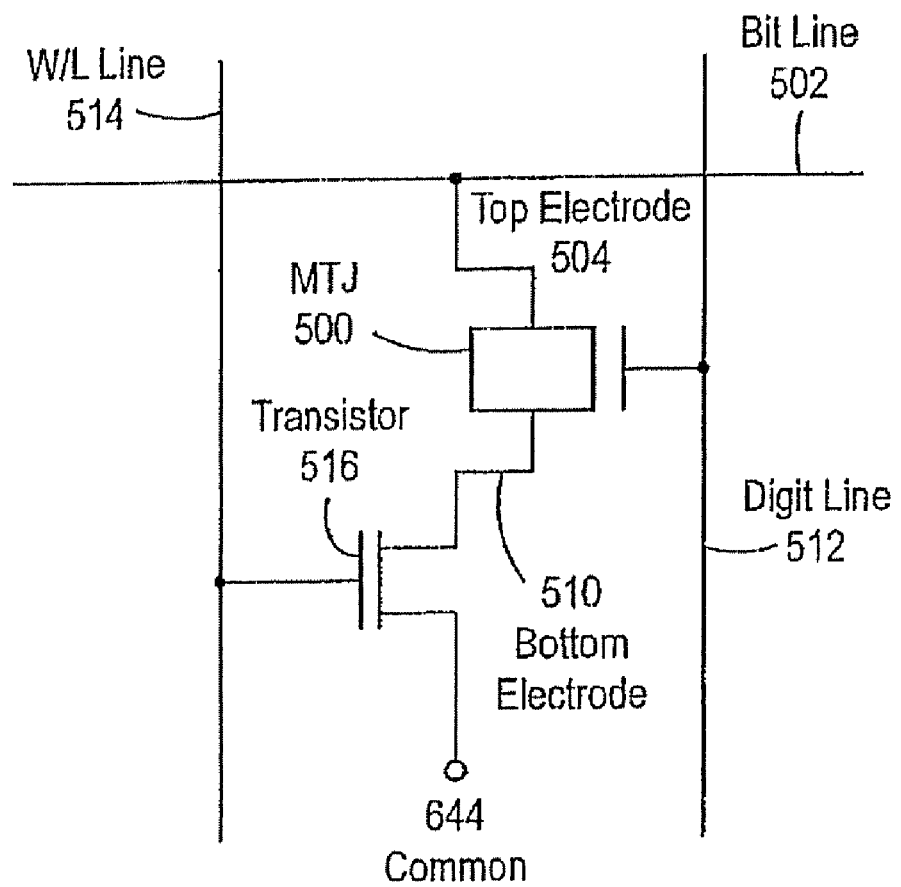
FIG. 6 illustrates an electronic circuit diagram of the device shown in FIG. 5.

The circuits shown in FIGS. 4A, 4B can be used for example with the circuits of FIGS. 3 and 6, to control or operate the MRAM. In particular, the circuit shown in FIG. 4A can be used to supply an appropriate voltage to the common (244, 644) connection of the transistor 216, 217, 516, 517, and the circuit shown in FIG. 4B can be used to generate an appropriate voltage for application to the bit line 202, 502.

The Table 1 below details operation of the circuits shown in FIGS. 4A and 4B by showing input signals and corresponding output signals. The output signals can be applied for example to the circuits of FIGS. 3 and 6. The input signal W/L signal can be the same as that applied to the W/L lines 214, 514 to control the transistors, and the input Up/Dn signal indicates a state to be written to the MRAM/MTJ cell. For a read operation that reads a state of the MTJ cell, the Up/Dn signal is a "don't care" situation—in other words, it does not matter whether the Up/Dn signal is a logical high or a logical low.

TABLE 1

|  |  | Read | Write | Write |
| --- | --- | --- | --- | --- |
| Input | W/L | 0 | 1 | 1 |
| Input | Up/Dn | (don't care) | 0 | 1 |
| Output | B/L | 1 | 1 | 0 |
| Output | Common | 0 | 0 | 1 |

FIG. 4A shows a circuit receiving a first input signal W/L that is the same as the signal applied to the gate of the transistor 216, 217, 516, 517 and a second input signal "Up/Dn" that indicates a desired state to be written to the MTJ 200, 201, 500, 501. The circuit outputs an appropriate voltage for application to the common (244, 644) connection of the transistor 216, 217, 616, 617. As shown in FIG. 4A, the signals W/L and Up/Dn are applied respectively to the lines 406, 408 which feed inputs of an AND gate 404 and a NAND gate 410 which respectively control transistors 402 and 414. In an exemplary embodiment, the transistors 402, 404 are turned off when a logical low voltage is applied to the gate, and are turned on when a logical high voltage is applied to the gate of the transistor. In an exemplary embodiment, the transistors 402, 404 are field effect transistors (FETs) that are off when a logical low voltage is applied to the gate and are on when a logical high voltage is applied to the gate of the transistor. As shown in FIG. 4A, a source of the transistor 402 is connected to a voltage source 412 having a voltage VT with the drain connected to an output 416 that supplies a voltage to the common (244, 644) connection of the transistor 216, 217, 616, 617. The gate of the transistor 414 is connected to the output of the logic gate 410, and the source and drain of the transistor 414 are connected between the output terminal 416 and a ground.

FIG. 4B illustrates a circuit that receives the input signals W/L and Up/Dn and outputs a corresponding voltage for application to the bit line 202, 502. In particular, the W/L signal is applied to an input 407 which feeds inputs of a NAND gate 405 and an AND gate 411. The Up/Dn signal is supplied via the input 409 to inputs of the logic gates 405 and 411. The logic gates 405 and 411 respectively control transistors 403 and 415, which in an exemplary embodiment are field effect transistors (FETs) that are off when a logical low voltage is applied to the transistor gate and are on when a logical high voltage is applied to the transistor gate. The transistor 403 is connected between a voltage source 413 having a voltage of VT, and an output terminal 417 that supplies an output voltage or signal, which can for example be applied to the bit line 202, 502. The transistor 415 is connected via its source and drain electrodes between the output 417 and ground.

Figure 5:
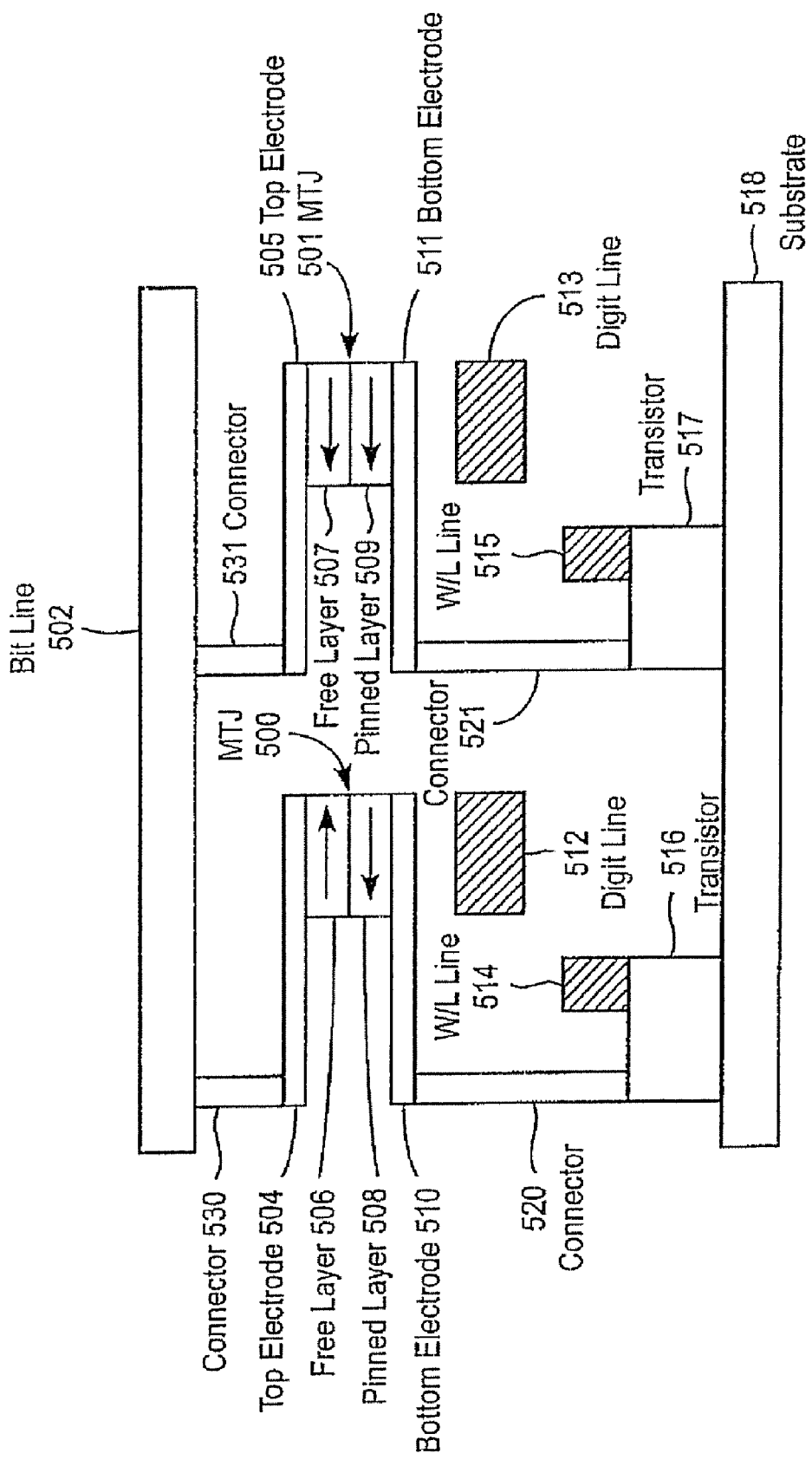
FIG. 5 illustrates another exemplary magnetic random access memory device.

FIG. 5 shows another exemplary embodiment which is similar in many respects to the embodiment shown in FIG. 4. One difference is that digit lines 512, 513 are respectively provided underneath the MTJs 500, 501. In addition, a lateral displacement between connections of the top electrode 504, 505 to the MTJ 500, 501 and connections between the top electrode 504, 505 and the connectors 530, 531 is greater than a lateral displacement between the top electrode 504, 505 connection to the electric power source (e.g., connectors 530, 531) and the top electrode 504, 505 connection to the MTJ 200, 201 shown in FIG. 2. This greater lateral displacement allows, for example, placement of digit lines 512, 513 beneath the MTJs 500, 501. FIG. 6 shows a circuit diagram corresponding to the configuration shown in FIG. 5.

FIG. 5 shows, in particular, a bit line 502 connected to top electrodes 504, 505 via connectors 530, 531. The top electrodes 504, 505 connect respectively to MTJs 500, 501 which each include a free layer 506, 507 and a pinned layer 508, 509. Bottom electrodes 510, 511 respectively connect the MTJs 500, 501 to transistors 516, 517 via connectors 520, 521. The transistors 516, 517 are positioned on a substrate 518, and are respectively controlled by W/L lines 514, 515 connected to the gates of the transistors 516, 517.

When a surface area of the MTJ that faces a top electrode or bottom electrode is large, then the configuration shown in FIG. 5 can be used, for example, so that a digit line can help switch the MTJ. When surface area of the MTJ that faces the top electrode or the bottom electrode is sufficiently smaller, then in an exemplary embodiment, the configuration shown in FIG. 2 can be used. For example, the configuration shown in FIG. 5 can be used when a surface area of the MTJ is greater than or equal to 0.3 square microns and the configuration shown in FIG. 2 can be used when an area of the MTJ facing the top electrode or the bottom electrode is less than or equal to 0.12 square microns. Other ranges can also be used, for example, the configuration of FIG. 5 can be used when the surface area of the MTJ is greater than 0.12 square microns and the configuration shown in FIG. 2 can be used when these surface of the MTJ is less than or equal to 0.3 square microns.

Hereinafter, magnetic memory devices according to embodiments of the present invention each including one MTJ will be described with reference to FIGS. 7 through 9. Detailed structures of MTJs are not illustrated in FIGS. 7 through 9.

Figure 7:
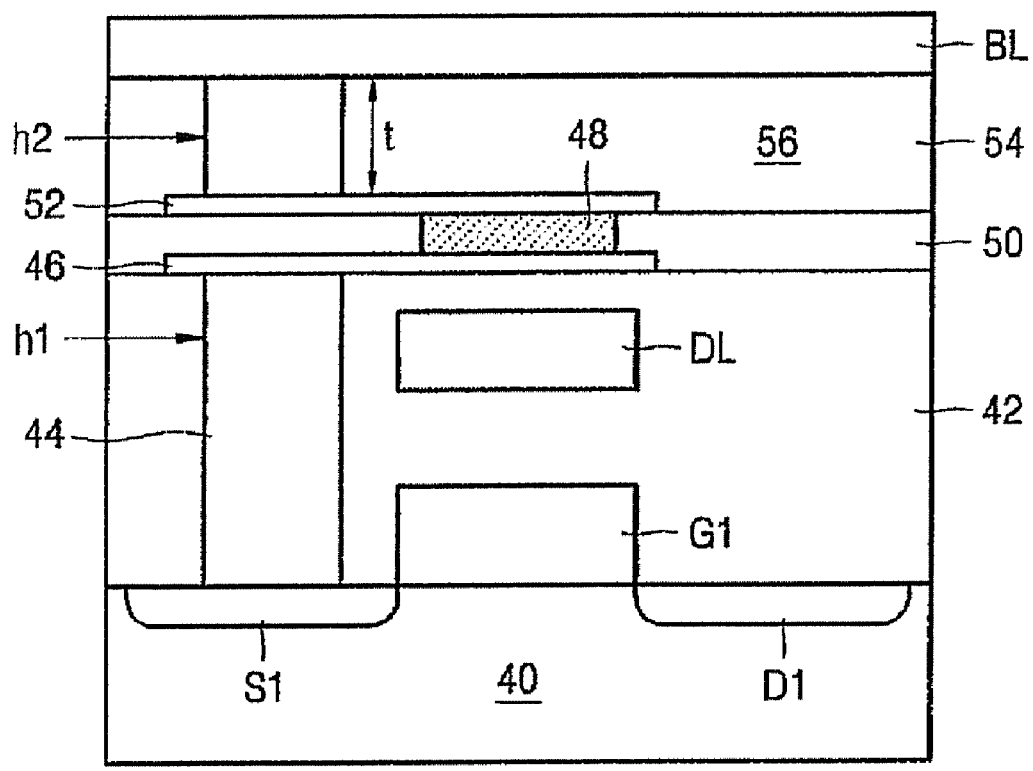
FIGS. 7, 8 and 9 illustrate exemplary embodiments of magnetic memory devices.

Referring to FIG. 7, in a magnetic memory device according to an embodiment of the present invention including one MTJ, a gate stack G1 including a gate dielectric layer and a gate electrode, which are sequentially stacked, in a predetermined region of a substrate 40. The substrate 40 may be a semiconductor substrate. A source S1 and a drain D1 are formed in regions of the substrate 40 between the gate stack G1 and isolation layers (not shown) existing on both sides of the gate stack G1. The gate stack G1, the source S1, and the drain D1 form a transistor. A digit line DL is located above the gate stack G1. The digit line DL can be used as a magnetic field generating component. Alternatively, the digit line DL may be located above the drain D1. The digit line DL is optional. In other words, the digit line DL may not be formed if required. A first interlayer insulating layer 42 covering the transistor and the digit line DL is formed on the substrate 40. A via hole h1 exposing the source S1 is formed in the first interlayer insulating layer 42. The via hole h1 is filled with a conductive plug 44. A lower electrode pad layer 46 covering an exposed surface of the conductive plug 44 is formed on a planar top surface of the first interlayer insulating layer 42. The lower electrode pad layer 46 is used as a first magnetic field generating component. The thickness and the width of the lower electrode pad layer 46 may be as small as possible. For example, the thickness of the lower electrode pad layer 46 may be 100 nm or less, and the width of the lower electrode pad layer 46 may be 100 nm or less. In addition, in consideration that a magnetic field generated by the lower electrode pad layer 46 is a factor affecting normal magnetization change in an MTJ, it is desirable that the intensity of the magnetic field generated by the lower electrode pad layer 46 is strong. In view of this, it is preferable that the width of the lower electrode pad layer 46 is small. An MTJ 48 is formed in a predetermined region of the lower electrode pad layer 46. The MTJ 48 may be located above the digit line DL. A second interlayer insulating layer 50 covering an exposed surface of the lower electrode pad layer 46 and the side of the MTJ 48 is formed on the first interlayer insulating layer 42. The second interlayer insulating layer 50 may be formed of the same insulating material as for the first interlayer insulating layer. An upper electrode pad layer 52 covering the exposed upper surface of the MTJ 48 is formed on the second interlayer insulating layer 50. The upper electrode pad layer 52 is used as a second magnetic field generating component. The upper electrode pad layer 52 may be located above the lower electrode pad layer 46. The upper electrode pad layer 52 determines the magnetic polarization state of a free magnetic layer of the MTJ 48 together with the lower electrode pad layer 46. In other words, the upper electrode pad layer 52 aligns the magnetic polarization orientation of the free magnetic layer in a fixed magnetic orientation of a pinned layer or in an opposite direction thereto. The upper electrode pad layer 52 may have the same geometrical shape as the lower pad conductive layer 46. A third interlayer insulating layer 54 covering the upper electrode pad layer 52 is formed on the second interlayer insulating layer 50. The third interlayer insulating layer 54 may be formed of the same insulating material as for the first interlayer insulating layer 42. A via hole h2 exposing a portion of the upper electrode pad layer 52 is formed in the third interlayer insulating layer 54. The via hole h2 may be formed above the via hole h1 formed in the first interlayer insulating layer 42. A bit line BL filling the via hole h2 to contact the upper electrode pad layer 52 is formed on the third interlayer insulating layer 54. To increase the selectivity of the MTJ 48, it is desirable to minimize an effect of a magnetic field generated by the bit line BL on the MTJ. Accordingly, the distance "t" between the bit line BL on the third interlayer insulating layer 54 and the upper electrode pad layer 52, which is substantially equal to the thickness of the third interlayer insulating layer 54, is determined to satisfy this requirement. The distance "t" between the bit line BL and the upper electrode pad layer 52 may be, for example, 300 nm.

A magnetic memory device according to another embodiment of the present invention including one MTJ will be described with reference to FIG. 8.

Figure 8:
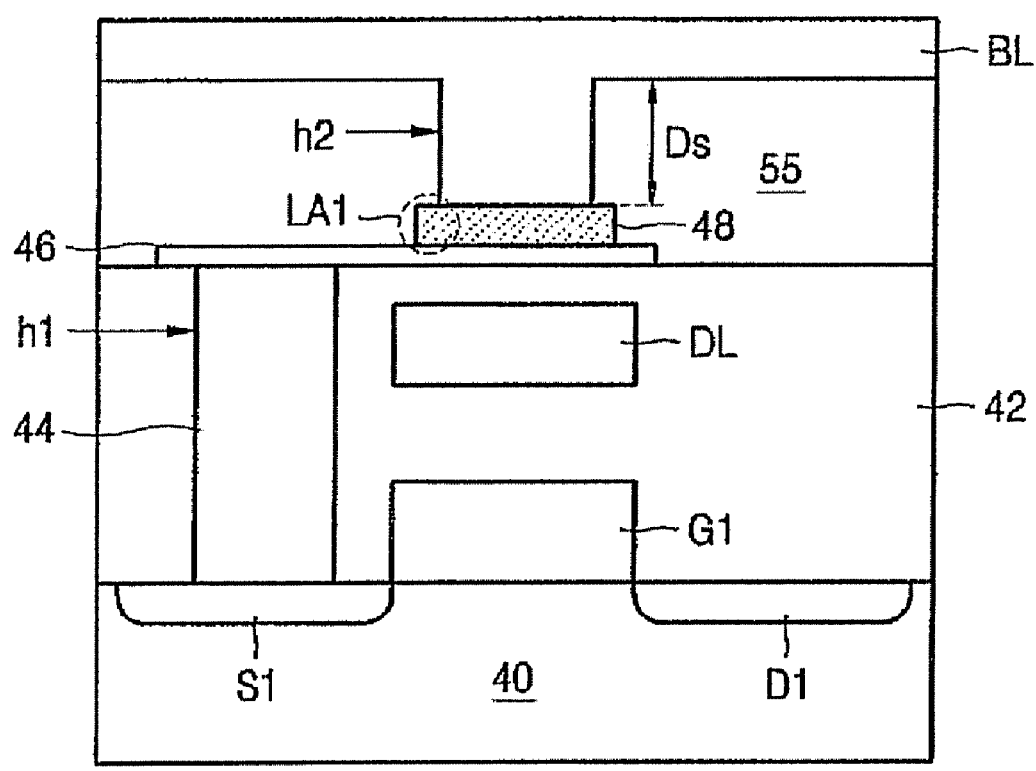

Referring to FIG. 8, the lower electrode pad layer 46 covering the exposed surface of the conductive plug 44 is formed on the first interlayer insulating layer 42. The lower electrode pad layer 46 is formed as a magnetic field generating component which generates a magnetic field concentrating in a local area LA1. The MTJ 48 is formed on the lower electrode pad layer 46. The MTJ 48 is separated a predetermined distance from the conductive plug 44. A second interlayer insulating layer 55 covering an exposed surface of the lower electrode pad layer 46 and the entire MTJ 48 is formed on the first interlayer insulating layer 42. A via hole h2 exposing a top surface of the MTJ 48 is formed in the second interlayer insulating layer 55. A bit line BL filling the via hole h2 to contact the exposed surface of the MTJ 48 is formed on the second interlayer insulating layer 55. The distance Ds between the bit line BL on the second interlayer insulating layer 55 and the MTJ 48 may be larger than the distance "t" in FIG. 7. Although a digit line DL below the lower electrode pad layer 46 is shown in FIG. 8, the digit line DL may be not formed.

A magnetic memory device according to another embodiment of the present invention including one MTJ will be described with reference to FIG. 9.

Figure 9:
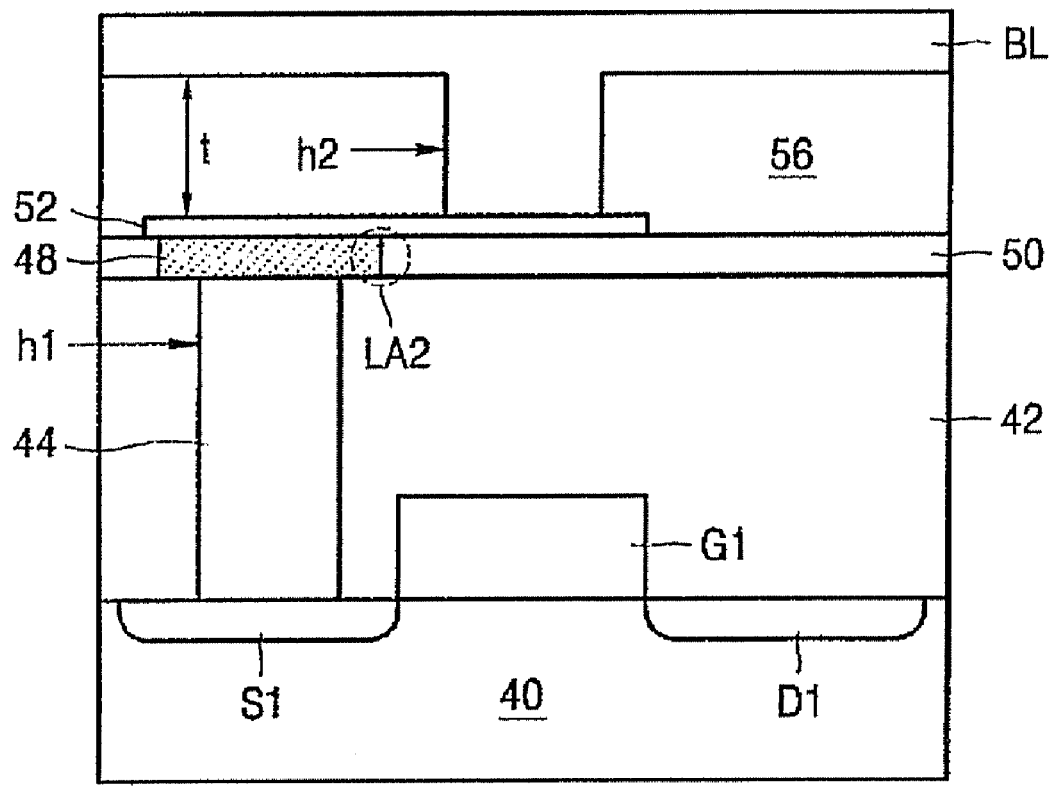

Referring to FIG. 9, a contact hole h1 exposing the source S1 is formed in the first interlayer insulating layer 42 covering a transistor. The contact hole h1 is filled with a conductive plug 44. The MTJ 48 covering an exposed surface of the conductive plug 44 is formed on the first interlayer insulating layer 42. The second interlayer insulating layer 50 surrounding sides of the MTJ 48 is formed on the first interlayer insulating layer 42. The upper electrode pad layer 52 contacting the top surface of the MTJ 48 is formed on the second insulating layer 50. The upper electrode pad layer 52 extends a predetermined distance above the gate stack G1. The upper electrode pad layer 52 is used as a magnetic field generating component which generates a magnetic field concentrating in a local area LA2. A third interlayer insulating layer 56 covering the upper electrode pad layer 52 is formed on the second interlayer insulating layer 50. A via hole h2, which exposes a portion of the upper electrode pad 52 and is separated from the MTJ 48, is formed in the third interlayer insulating layer 56. A bit line BL filing the second via hole h2 to contact the exposed surface of the upper electrode pad layer 52 is formed on the third interlayer insulting layer 56.

Figure 10:
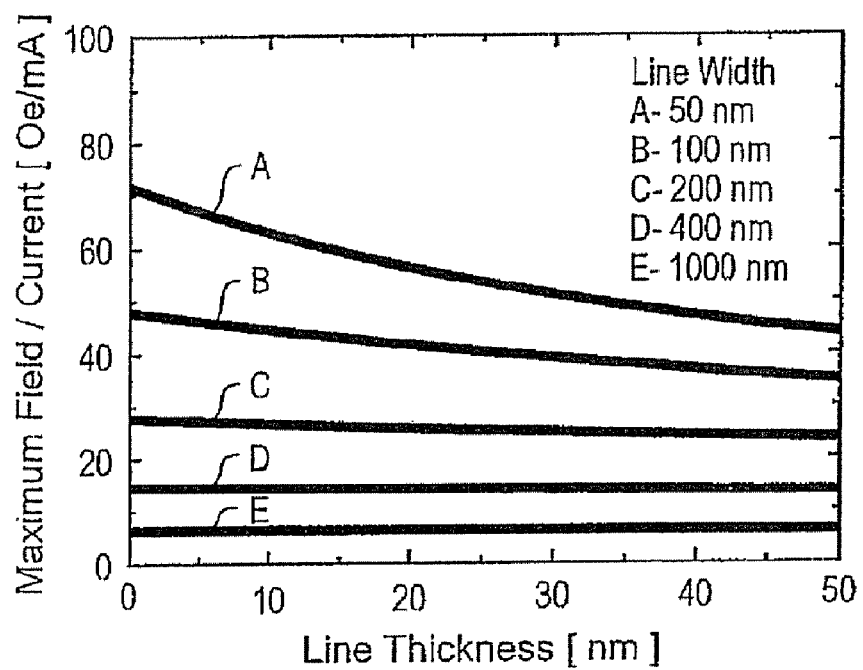
FIG. 10 illustrates exemplary maximum field/current values corresponding to line width and thickness combinations.
Figure 11:
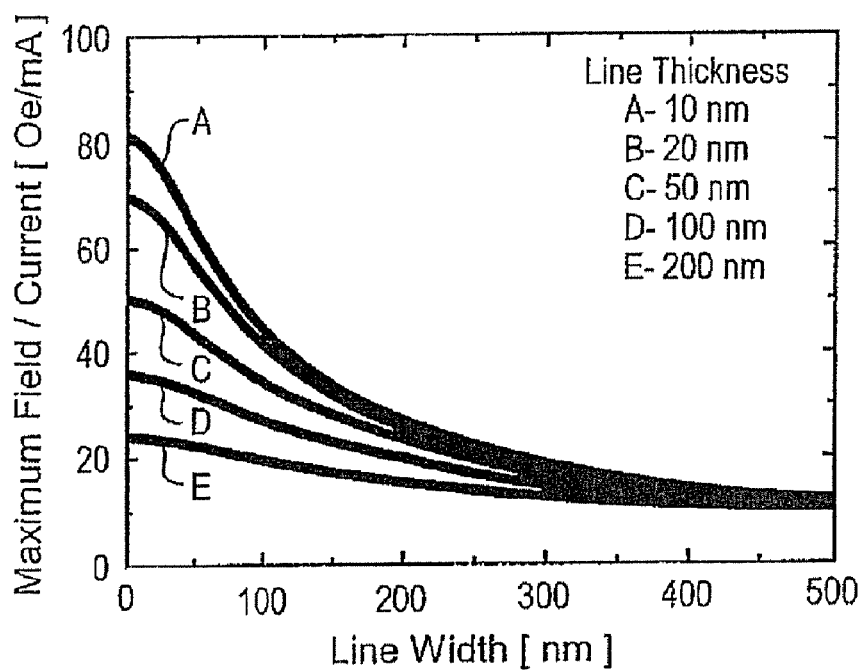
FIG. 11 illustrates exemplary maximum field/current ratio values corresponding to specific pairs of line width and line thickness values.

FIGS. 10 and 11 illustrate maximum magnetic field strength/current ratios with respect to dimensions of a bottom electrode or electrical lines closest to a pinned layer of a MTJ of MRAMs consistent with various embodiments described herein. "Maximum field" refers to the maximum magnetic field generated around the bottom electrode 210, 510 when current flows through the bottom electrode 210, 510. In particular, FIG. 10 shows ratios versus line thickness for different line widths, and FIG. 11 shows ratios versus line width for different line thicknesses. FIGS. 10 and 11 show data for an exemplary MTJ whose cumulative thickness for all layers except for the free layer is 20 nanometers, where a line thickness is the dimension of a bottom electrode extending in a direction away from the MTJ and a line width is a dimension of the bottom electrode along a contact surface of the bottom electrode with the MTJ. In an exemplary embodiment, this MTJ consists of a free layer, a pinned layer, an aluminum oxide layer between the free layer and the pinned layer, and a platinum manganese layer between the pinned layer and the bottom electrode.

Figure 12:
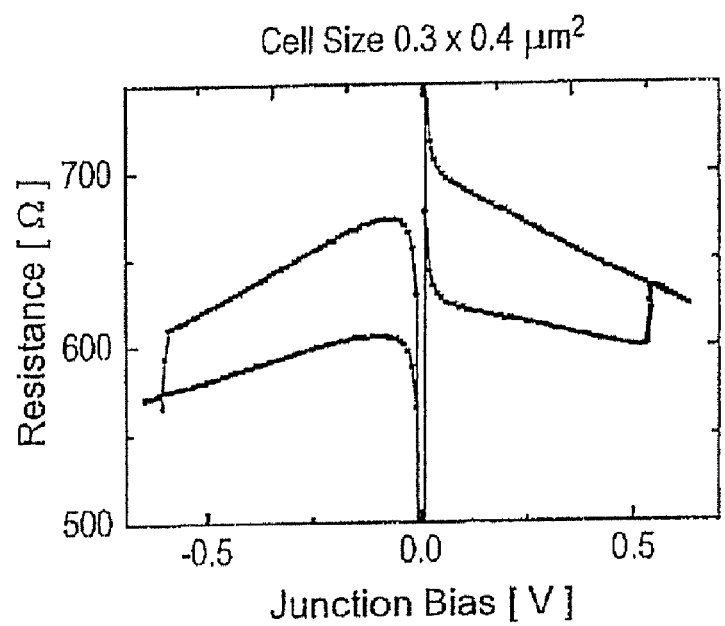
FIG. 12 illustrates exemplary switching behavior of a magnetic tunnel junction cell having a planar footprint of 0.12 square microns.

FIG. 12 illustrates switching behavior of a exemplary MTJs employed in the configuration shown in FIG. 2, wherein an area of each MTJ cell is 0.12 square microns (e.g., 0.3 by 0.4 microns square) and the plot shown in FIG. 12 shows a junction bias voltage along the x axis and resistance of the MTJ cell along the y axis. In particular, the uppermost curves at any point along the x axis illustrate a high resistance state and the lower curves illustrate a low resistance state. Transitions between lower and higher curves indicate a switching event of the corresponding MTJ.

Figure 13:
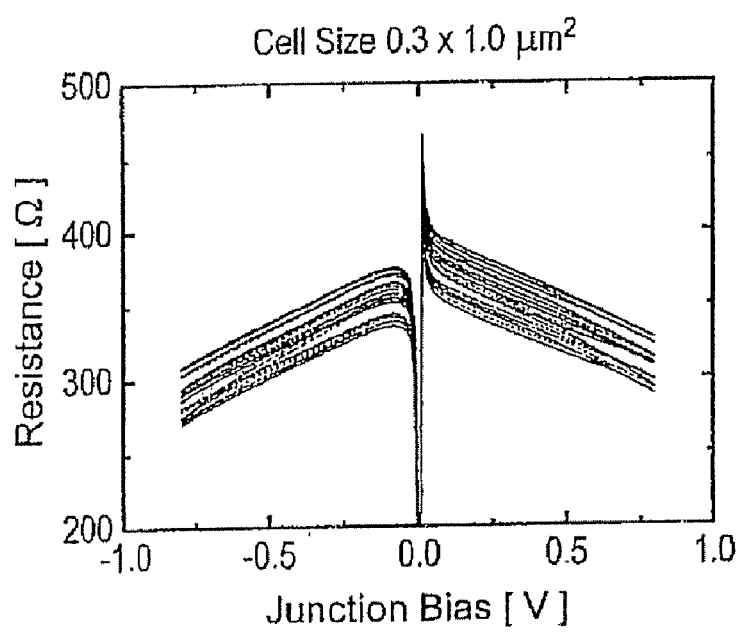
FIGS. 13-15 illustrate exemplary switching behavior of a magnetic tunnel junction cell having a planar footprint of 0.3 square microns, at different digit line currents.
Figure 14:
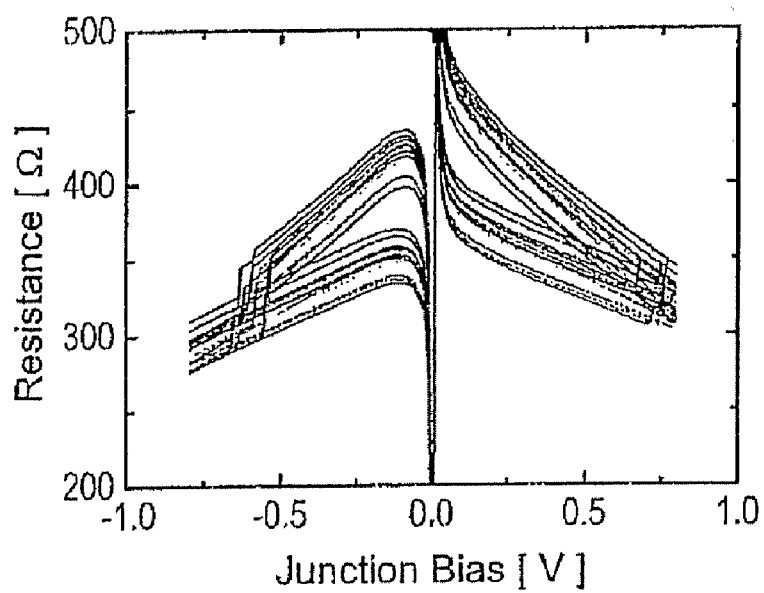
Figure 15:
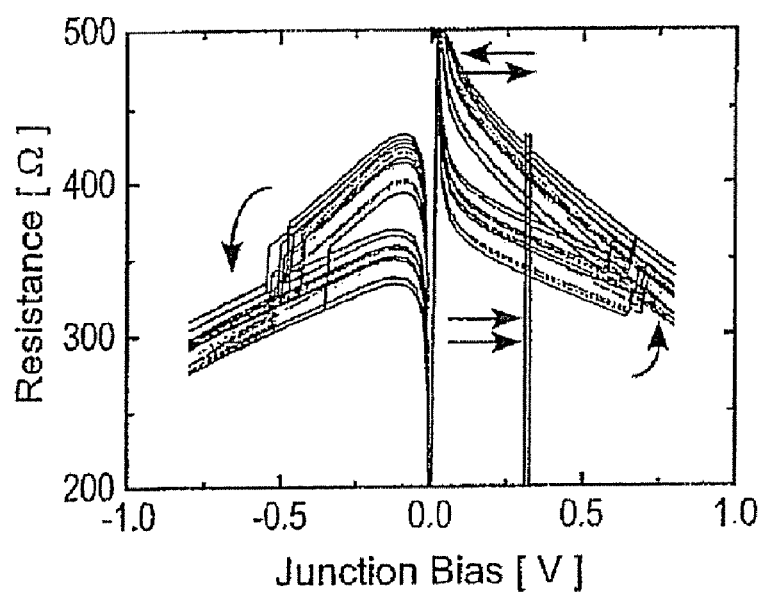

FIGS. 13-15 illustrate switching behavior of a exemplary MTJ cells having an area of 0.3 square microns (e.g., 0.3 microns by 1 micron square) where resistance of the MTJ cell is indicated on the y axis and a junction bias voltage is indicated on the x axis. The behavior shown in FIGS. 10-12 corresponds to MTJ cells employed in the configuration of FIG. 5, where a digit line 512, 513 is available to influence behavior of the MTJ, e.g., the MTJ 500 or 501. In particular, FIG. 13 illustrates behavior of the MTJ cell when a current through the digit line is zero. As can be seen from FIG. 13, switching does not occur within the applied junction bias voltage ranges shown in FIG. 13 when a digit line current is zero. FIG. 14 illustrates behavior of the MTJ given a digit line current of 7.5 milliamperes, and further indicates that switching behavior occurs near junction bias voltages of −0.6 volts and positive 0.7 volts. FIG. 15 illustrates that further increasing the digit line current, e.g., 2 milliamperes, allows switching events to occur at lower junction bias voltages. In particular, FIG. 15 shows that given a digit line current of 10 milliamperes, switching will occur near a junction bias voltage of −0.5 volts and near a positive junction bias voltage of 0.6 volts. The high resistance curves in FIGS. 12-15 correspond to anti-parallel magnetic orientations of the free and pinned layers of the MTJs, and the lower resistance curves correspond to parallel magnetic orientations of the free and pinned layers of the MTJs.

A method of manufacturing the magnetic memory device of FIG. 7 will be described.

Figure 16:
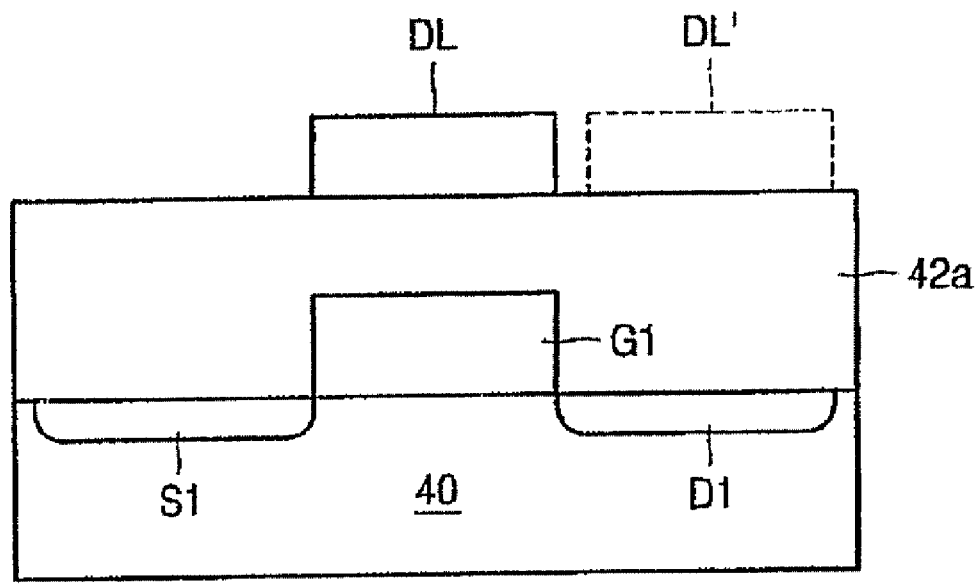
FIGS. 16-22 illustrate exemplary methods of manufacturing the magnetic memory devices.

Referring to FIG. 16, an active area and a field area are defined in the substrate 40. Next, an isolation layer (not shown) having a predetermined shape is formed in the field region. The substrate 40 may be a semiconductor substrate, for example, a p-type or n-type silicon substrate. The gate stack G1 is formed in a predetermined region of the active area. The gate stack G1 is formed by sequentially stacking a gate dielectric layer, a conductive layer for a gate electrode, and a gate protective layer on the entire surface of the substrate 40, forming a mask (not shown) defining a region on which the gate stack G1 to be formed in the gate protective layer, and etching the stacked material layers in reverse order. After etching the stacked material layers, the mask is removed. The gate stack G1 has spacers (not shown) on its sidewalls.

After forming the gate stack G1, the source S1 and the drain D1 are formed on both sides of the gate stack G1 through an ion doping process, thereby forming a FET on the substrate 40.

To form the magnetic memory devices of FIGS. 2 and 5, a FET which shares the drain D1 with the FET may be additionally formed on the substrate 40.

Subsequently, a first insulating layer 42a covering the transistor is formed on the substrate 40. The top surface of the first insulating layer 42a is planarized. A digit line DL is formed on a predetermined region of the first insulating layer 42a. Although the digit line DL is formed above the gate stack G1, the digit line DL may be formed above the drain D1 as indicated by dashed lines DL'.

Figure 17:
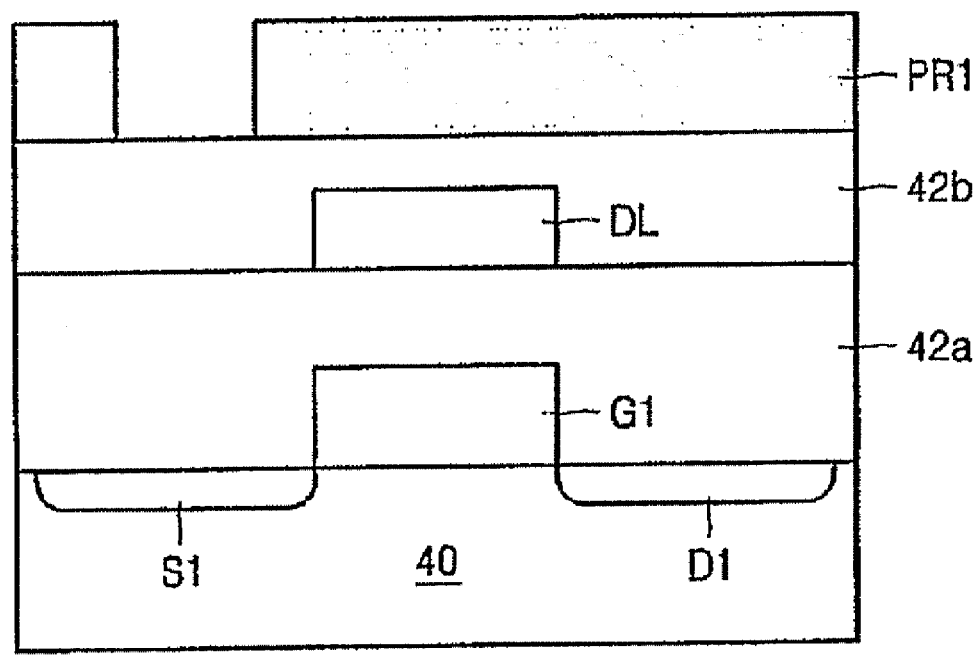
Figure 18:
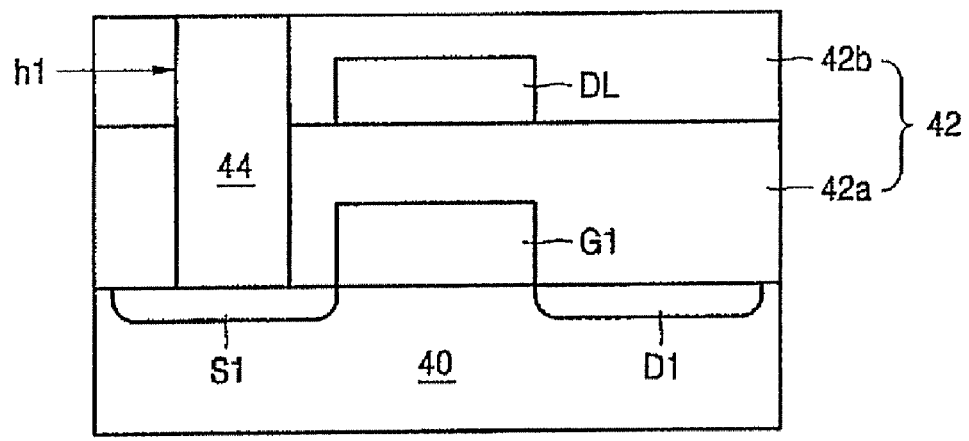

Referring to FIG. 17, a second insulating layer 42b covering the digit line DL is formed on the first insulating layer 42a. The top surface of the second insulating layer 42b is planarized. A photoresist pattern PR1 exposing a predetermined region of the second insulating layer 42b above the source S1 is formed on the first insulating layer 42b. The exposed region of the second insulating layer 41b is etched using the photoresist pattern PR1 as an etching mask. Next, the photoresist pattern PR1 is removed. This etching process is performed until the source S1 is exposed. As a result of the etching process, as illustrated in FIG. 18, a via hole h1 exposing the source S1 is formed in the first interlayer insulating layer 42 consisting of the first and second insulating layers 42a and 4b. After the via hole h1 is formed, the via hole h1 is filled with a conductive plug 44. An ohmic contact process may be performed before or after the formation of the conductive plug 44.

Figure 19:
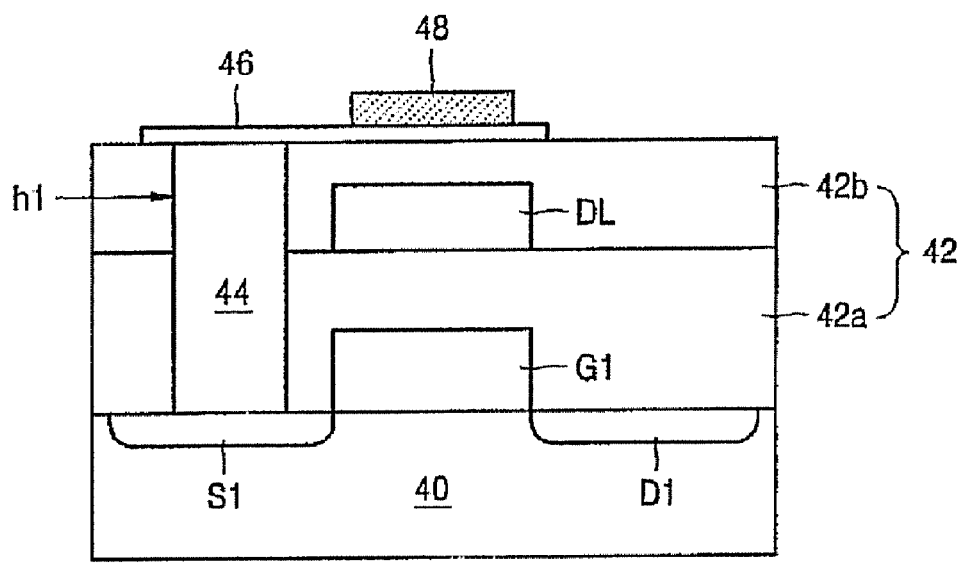

Referring to FIG. 19, the lower electrode pad layer 46 is formed on the second insulating layer 42b. The lower electrode pad layer 46 is formed to contact the entire exposed surface of the conductive plug 44 and extend above the digit line DL. The lower electrode pad layer 46 can be formed by forming a lower electrode material layer on the second insulating layer 42b and patterning the lower electrode material layer into the lower electrode pad layer 46 using photolithography and etching processes. The lower electrode material layer may be formed to be as thin as possible. For example, the lower electrode material layer may have a thickness of 100 nm or less. In addition, when etching the lower electrode material layer, the lower electrode material layer may be etched to form the lower electrode pad layer 46 having a width that is as small as possible, for example, 100 nm or less. By forming the lower electrode pad layer 46 with a small thickness and width, an magnetic field generated by the lower electrode pad layer 46 as current is supplied to the lower electrode pad layer 46 can be concentrated in the MTJ 48 formed on the lower electrode layer 46. After forming the lower electrode pad layer 46, the MTJ 48 including a pinning layer, a pinned layer, a tunneling layer, a free magnetic layer, etc. is formed on a predetermined region of the lower electrode pad layer 46. Methods of forming the MTJ 48 are widely known. Accordingly, a detailed description thereon will not be provided here. The MTJ 48 may be formed to the side of the lower electrode pad layer 46 away from the conductive plug 44. In this case, the lower electrode pad layer 46 may be located above the digit line DL. In addition, when the digit line DL is formed above the drain D1, as indicated by dashed lines DL' in FIG. 7, the lower electrode pad layer 46 extends above the digit line DL, and the MTJ 48 is formed above the digit line DL.

Figure 20:
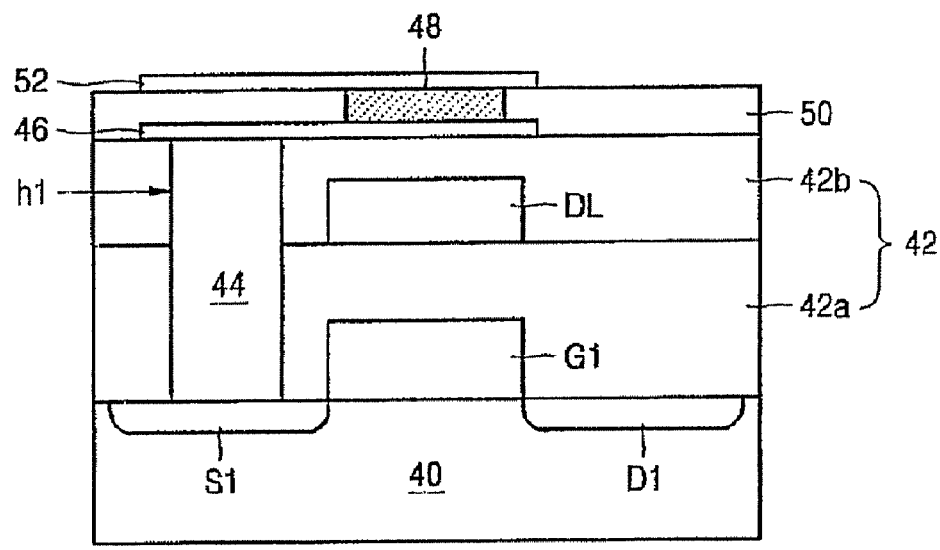

Referring to FIG. 20, the second interlayer insulating layer 50 covering the lower electrode pad layer 46 and the MTJ 48 is formed on the first interlayer insulating layer 42. The second interlayer insulating layer 50 may be formed of the same material as for the first interlayer insulating layer 42. After the second interlayer insulating layer 50 is formed, the top surface of the second interlayer insulating layer 50 is polished until the MTJ 48 is exposed. Next, the upper electrode pad layer 52 contacting the entire exposed surface of the MTJ 48 is formed on the second interlayer insulating layer 50. The upper electrode pad layer 52 functions the same as the lower electrode pad layer 46. The upper electrode pad layer 52 may have the same geometrical shape as the lower electrode pad layer 46 and be formed above the lower electrode pad layer 46. The upper electrode pad layer 52 may be formed using the same method as for the lower electrode pad layer 46.

Figure 21:
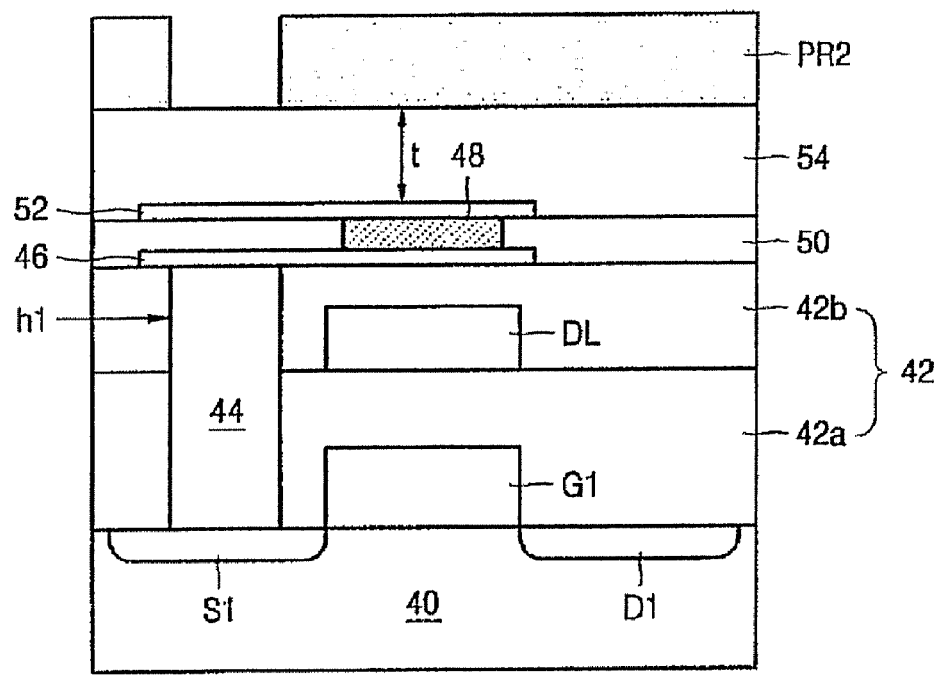
Figure 22:
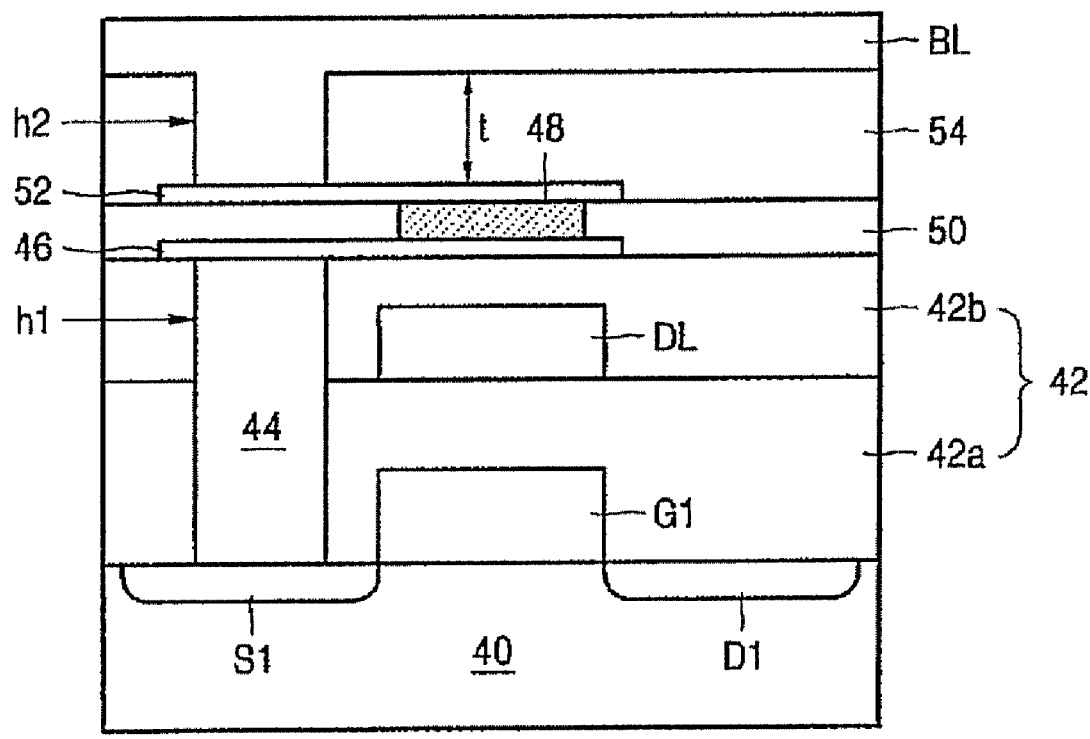

Referring to FIG. 21, the third interlayer insulating layer 54 covering the upper electrode pad layer 52 is formed on the second interlayer insulating layer 50. Here, the third interlayer insulating layer 54 is formed such that the distance "t" between the top surface of the upper electrode pad layer 52 and the top surface of the third interlayer insulating layer 54 becomes about 200 nm after a subsequent etching process is formed. The distance "t" may be varied in consideration of the effect of a magnetic field generated by bit lines to be formed in a subsequent process on the MTJ 48. For example, if the magnetic field generated by bit lines can affect the magnetic polarization orientation of the free magnetic layer of the MTJ 48, the distance "t" is determined to be 300 nm or greater. Otherwise, the distance "t" is determined to be smaller than 300 nm. Subsequently, a photoresist pattern PR2 exposing a predetermined region of the third interlayer insulating layer 54 is formed on the third interlayer insulating layer 54. The photoresist pattern PR2 is used to expose a portion of the upper electrode pad layer 52 above the conductive plug 44. Therefore, the photoresist pattern PR2 is formed to expose a portion of the third interlayer insulating layer 54 above the portion of the upper electrode pad layer 52 to be exposed. The exposed portion of the third interlayer insulating layer 54 is etched using the photoresist pattern PR2 as an etching mask. This etching process is performed until the upper electrode pad layer 52 is exposed. Next, the photoresist pattern PR2 is removed. As a result of the etching process, as illustrated in FIG. 22, a via hole h2 exposing the portion of the third interlayer insulating layer 54 corresponding to the conductive plug 44 is formed in the third interlayer insulating layer 54. After the via hole h2 is formed, the bit line BL filling the via hole h2 and contacting the exposed portion of the upper electrode pad layer 52 is formed on the third interlayer insulating layer 54.

The magnetic memory devices of FIGS. 8 and 9 are characterized in that only one of the upper and lower electrode pad layers 52 and 46 is included. Methods of manufacturing the magnetic memory devices of FIGS. 8 and 9 are substantially the same as the method of manufacturing the magnetic memory device of FIG. 7 including both the upper and lower electrode pad layers 52 and 46, except that the process of forming one of the upper and lower electrode layers 52 and 46 is not performed. Accordingly, detailed descriptions on the methods of manufacturing the magnetic memory devices of FIGS. 8 and 9 are not provided here.

In addition, in consideration of the structures of the magnetic memory devices of FIGS. 2 and 5, methods of manufacturing the magnetic memory devices of FIGS. 2 and 5 are not greatly different from the method of manufacturing the magnetic memory device of FIG. 7. Accordingly, detailed descriptions on the methods of manufacturing the magnetic memory devices of FIGS. 2 and 5 are not provided here.

For the sake of simplicity, the MTJs shown in FIGS. 2 and 5 (e.g., MTJs 200, 201, 500, 501) are each shown with only two layers, a free layer and a pinned layer. However, the MTJs can also include additional layers depending on the particular technology or construction techniques used to implement them. For example, each MTJ can include a free layer and a pinned layer with a spacer layer between the free layer and the pinned layer, as well as a pinning layer on an opposite side of the pinned layer from the spacer layer. In addition, although various elements in the FIGS. 2-6 are illustrated as monolithic or formed out of a single material or component, in fact each can be formed by or include multiple layers or subcomponents. Thus, although various elements may be shown in the Figures in simplified form for purposes of illustration and description, these elements can include any variety of components, subcomponents, connections or features necessary or desirable to perform their respective functions. Although the magnetization directions of the MTJ free layers and pinned layers are shown in FIGS. 1 and 5 as being parallel or antiparallel to (a) a displacement direction of connections to the top electrodes and bottom electrodes and (b) directions of current flows traversing the top electrodes, the displacement and top electrode current flow directions can be arranged at any desired angle to the magnetization directions. For example, the MTJ can be rotated or oriented around an axis that extends through the top and bottom electrodes and is vertical with respect to the views of FIGS. 2 and 5.

It will also be appreciated by those skilled in the art that the present invention can be embodied in other specific forms without departing from the spirit or essential characteristics thereof, and that the invention is not limited to the specific embodiments described herein. The presently disclosed embodiments are therefore considered in all respects to be illustrative and not restrictive. The scope of the invention is indicated by the appended claims rather than the foregoing description, and all changes that come within the meaning and range and equivalents thereof are intended to be embraced therein. The term "comprising" as used herein is open-ended and not exclusive.

What is claimed is:

1. A method of manufacturing a magnetic memory device, the method comprising:
   forming a transistor in a substrate;
   forming on the substrate a first interlayer insulating layer covering the transistor;
   forming in the first interlayer insulating layer a via hole exposing a source of the transistor;
   filling the via hole with a conductive plug;
   forming on the first interlayer insulating layer a first magnetic field generating component contacting the conductive plug; and
   forming an MTJ (magnetic tunnel junction) on a predetermined region of the first magnetic field generating component separated from the conductive plug,
   wherein the width and the thickness of the lower electrode pad layer are 100 nm or less.

2. The method of claim 1, wherein the first magnetic field generating component is a lower electrode pad layer connecting the conductive plug and the MTJ.

3. The method of claim 1, wherein the forming of the first interlayer insulating layer comprises:
   forming on the substrate a first insulating layer covering the transistor;
   forming on the first insulating layer a second magnetic field generating component perpendicular to the first magnetic field generating component; and
   forming on the first insulating layer a second insulating layer covering the second magnetic field generating component.

4. The method of claim 3, wherein the second magnetic field generating component is a conductive wire generating a magnetic field in the direction of a hard axis of the MTJ.

5. The method of claim 1, further comprising:
   forming on the first interlayer insulating layer a second interlayer insulating layer covering the first magnetic generating component and the MTJ;
   forming in the second interlayer insulating layer a via hole exposing a top surface of the MTJ; and
   forming on the second interlayer insulating layer a bit line filling the via hole.

6. The method of claim 5, wherein the MTJ and the bit line are separated by at least 300 nm.

7. The method of claim 1, further comprising:
forming on the first interlayer insulating layer a second interlayer insulating layer covering the first magnetic field generating component and the MTJ;
planarizing the second interlayer insulating layer until a top surface of the MTJ is exposed;
forming on the second interlayer insulating layer a second magnetic field generating component having a first end portion contacting the exposed top surface of the MTJ;
forming on the second interlayer insulating layer a third interlayer insulating layer covering the second magnetic field generating component;
forming in the third interlayer insulating layer a via hole exposing a second end portion of the second magnetic field generating component; and
forming on the third interlayer insulating layer a bit line filing the via hole exposing the second magnetic field generating component.

8. The method of claim 7, wherein the first and second magnetic field generating components are parallel to each other.

9. The method of claim 7, wherein the second magnetic field generating component is an upper electrode pad layer connecting the bit line and the top surface of the MTJ.

10. The method of claim 1, wherein the transistor comprises first and second transistors which share one drain, the via hole comprises first and second via holes respectively exposing sources of the first and second transistors, the conductive plug comprises first and second conductive plugs respectively filling the first and second via holes, the first magnetic field generating component comprises a first lower electrode pad layer having a first end portion contacting the first conductive plug and a second lower electrode pad layer having a first end portion contacting the second conductive plug, and the MTJ comprises a first MTJ formed on a second end portion of the first lower electrode pad layer and a second MTJ formed on a second end portion of the second lower electrode pad layer.

11. The method of claim 7, wherein the transistor comprises first and second transistors which share one drain, the via hole comprises first and second via holes respectively exposing sources of the first and second transistors, the conductive plug comprises first and second conductive plugs respectively filling the first and second via holes, the first magnetic field generating component comprises a first lower electrode pad layer having a first end portion contacting the first conductive plug and a second lower electrode pad layer having a first end portion contacting the second conductive plug, the MTJ comprises a first MTJ formed on a second end portion of the first lower electrode pad layer and a second MTJ formed on a second end portion of the second lower electrode pad layer; and the second magnetic field generating component comprises a first upper electrode pad layer having a first end portion contacting a top surface of the first MTJ and a second end portion contacting the bit line and a second upper electrode pad layer having a first end portion contacting a top surface of the second MTJ and a second end portion contacting the bit line.

12. The method of claim 11, wherein the first and second lower electrode pad layers and the first and second upper electrode pad layers have the same thickness and the same width.

13. A method of manufacturing a magnetic memory device, the method comprising:
forming a transistor in a substrate;
forming on the substrate a first interlayer insulating layer covering the transistor;
forming in the first interlayer insulating layer a via hole exposing a source of the transistor;
filling the via hole with a conductive plug;
forming on the first interlayer insulating layer a first magnetic field generating component contacting the conductive plug;
forming an MTJ (magnetic tunnel junction) on a predetermined region of the first magnetic field generating component separated from the conductive plug;
forming on the first interlayer insulating layer a second interlayer insulating layer covering the first magnetic field generating component and the MTJ;
planarizing the second interlayer insulating layer until a top surface of the MTJ is exposed;
forming on the second interlayer insulating layer a second magnetic field generating component having a first end portion contacting the exposed top surface of the MTJ;
forming on the second interlayer insulating layer a third interlayer insulating layer covering the second magnetic field generating component;
forming in the third interlayer insulating layer a via hole exposing a second end portion of the second magnetic field generating component; and
forming on the third interlayer insulating layer a bit line filing the via hole exposing the second magnetic field generating component
wherein the second magnetic field generating component and the bit line are separated by about 300 nm.

14. A method of manufacturing a magnetic memory device, the method comprising:
forming a transistor in a substrate;
forming on the substrate a first interlayer insulating layer covering the transistor;
forming in the first interlayer insulating layer a via hole exposing a source of the transistor;
filling the via hole with a conductive plug;
forming on the first interlayer insulating layer a first magnetic field generating component contacting the conductive plug;
forming an MTJ (magnetic tunnel junction) on a predetermined region of the first magnetic field generating component separated from the conductive plug;
forming on the first interlayer insulating layer a second interlayer insulating layer covering the first magnetic field generating component and the MTJ;
planarizing the second interlayer insulating layer until a top surface of the MTJ is exposed;
forming on the second interlayer insulating layer a second magnetic field generating component having a first end portion contacting the exposed top surface of the MTJ;
forming on the second interlayer insulating layer a third interlayer insulating layer covering the second magnetic field generating component;
forming in the third interlayer insulating layer a via hole exposing a second end portion of the second magnetic field generating component; and
forming on the third interlayer insulating layer a bit line filing the via hole exposing the second magnetic field generating component;
wherein the second magnetic field generating component is an upper electrode pad layer connecting the bit line and the top surface of the MTJ; and
wherein the second magnetic field generating component is an upper electrode pad layer connecting the bit line and the top surface of the MTJ and.
wherein the width and the thickness of the upper electrode pad layer are 100 nm or less.

15. A method of manufacturing a magnetic memory device, the method comprising:

forming a transistor in a substrate;

forming on the substrate a first interlayer insulating layer covering the transistor;

forming in the first interlayer insulating layer a via hole exposing a source of the transistor;

filling the via hole with a conductive plug;

forming on the first interlayer insulating layer an MTJ (magnetic tunnel junction) cell covering a top surface of the conductive plug;

forming on the first interlayer insulating layer a second interlayer insulating layer surrounding sides of the MTJ; and forming on the second interlayer insulating layer a first magnetic field generating component having a first end portion contacting a top surface of the MTJ and a second end portion contacting the bit line, wherein the thickness and the width of the upper electrode pad layer are 100 nm or less.

16. The method of claim 15, wherein the first magnetic field generating component is an upper electrode pad layer.

\* \* \* \* \*